United States Patent
Adel et al.

(10) Patent No.: US 7,679,069 B2
(45) Date of Patent: Mar. 16, 2010

(54) METHOD AND SYSTEM FOR OPTIMIZING ALIGNMENT PERFORMANCE IN A FLEET OF EXPOSURE TOOLS

(75) Inventors: Michael E. Adel, Zichron Ya'akov (IL); John Robinson, Austin, TX (US); Pavel Izikson, Haifa (IL); Brad Eichelberger, Dillsburg, PA (US); Amir Widmann, Sunnyvale, CA (US); Atsuhiko Kato, Tokyo (JP)

(73) Assignee: KLA-Tencor Technologies Corporation, Milpitas, CA (US)

( * ) Notice: Subject to any disclaimer, the term of this patent is extended or adjusted under 35 U.S.C. 154(b) by 471 days.

(21) Appl. No.: 11/686,871

(22) Filed: Mar. 15, 2007

(65) Prior Publication Data

US 2008/0073589 A1 Mar. 27, 2008

Related U.S. Application Data

(60) Provisional application No. 60/783,696, filed on Mar. 16, 2006, provisional application No. 60/891,209, filed on Feb. 22, 2007.

(51) Int. Cl.
  *G21K 1/00* (2006.01)
(52) U.S. Cl. ............. 250/491.1; 250/492.1; 250/492.2; 250/492.3
(58) Field of Classification Search ............. 250/491.1, 250/492.1, 492.2, 492.22, 492.3, 492.21; 430/296, 297, 298, 299, 302; 355/52, 53; 356/399
  See application file for complete search history.

(56) References Cited

U.S. PATENT DOCUMENTS 5,525,808 A * 6/1996 Irie et al. ................... 250/548

6,163,366 A * 12/2000 Okamoto et al. .............. 355/53
2006/0028645 A1* 2/2006 Kawamura ................. 356/399
2008/0144031 A1* 6/2008 Ausschnitt et al. .......... 356/401

OTHER PUBLICATIONS

Merrill et al., "Misregistration metrology tool matching in a one megabit production environment", Proceedings of SPIE vol. 1673 (1992).*
Stephen DeMoor et al., "Scanner Overlay Mix and Match Matrix Generation; Capturing all Sources of Variation", Metrology, Inspection, and Process Control for Microlithography XVIII, edited by Richard M. Silver, Proceedings of SPIE vol. 5375 (SPIE, Bellingham, WA, 2004), pp. 66-77.
International Search Report from corresponding PCT application PCT/US07/06569, mailed Jul. 17, 2008.
Written Opinion from corresponding PCT application PCT/US07/06569, mailed Jul. 17, 2008.
DeMoor et al., "Scanner Overlay Mix and Match Matrix Generation;Capturing all Sources of Variation," Proceedings of SPIE vol. 5375, (2004) pp. 66-77.

* cited by examiner

*Primary Examiner*—Jack I Berman
*Assistant Examiner*—Nicole Ippolito Rausch
(74) *Attorney, Agent, or Firm*—Suiter Swantz pc llo

(57) ABSTRACT

A method for optimizing alignment performance in a fleet of exposure systems involves characterizing each exposure system in a fleet of exposure systems to generate a set of distinctive distortion profiles associated with each exposure system. The set of distinctive distortion profiles are stored in a database. A wafer having reference pattern formed thereon is provided for further pattern fabrication and an exposure system is selected from the fleet to fabricate a next layer on the wafer. Linear and higher order parameters of the selected exposure system are adjusted using the distinctive distortion profiles to model the distortion of the reference pattern. Once the exposure system is adjusted, it is used to form a lithographic pattern on the wafer.

35 Claims, 3 Drawing Sheets

METHOD AND SYSTEM FOR OPTIMIZING ALIGNMENT PERFORMANCE IN A FLEET OF EXPOSURE TOOLS

CROSS REFERENCE TO RELATED PATENT APPLICATIONS

This application is related to, and claims priority from, the following U.S. Provisional patent applications:

(1) Application No. 60/783,696, entitled "Apparatus and Methods for Optimizing Alignment Performance and Productivity in a Fleet of Exposure Tools", by Mike Adel et al., filed Mar. 16, 2006.

(2) Application No. 60/891,209, entitled "Apparatus and Methods for Optimizing Alignment Performance and Productivity in a Fleet of Exposure Tools", by Mike Adel et al., filed Feb. 22, 2007.

These applications are herein incorporated by reference in their entirety.

TECHNICAL FIELD

The invention described herein pertains to methods and approaches used to optimize the alignment performance and the productivity of a fleet of exposure tools in a lithography cell of a semiconductor fabrication facility.

BACKGROUND

As the density and complexity of microcircuits continue to increase, the photolithographic processes used to print circuit patterns becomes more and more challenging. Previous technologies and thinking in the art has required denser and more complex patterns to achieve the formation of the denser circuits consisting of smaller pattern elements packed more closely together. Such patterns push the resolution limits of available lithography tools and processes and place ever increasing burdens on the photolithography processes used to form the many layers of a semiconductor wafer design pattern.

One of the most time consuming and labor intensive tasks undertaken in the lithography cell of a high productivity semiconductor manufacturing plant is that of ensuring good quality alignment performance of a stepper or scanner with minimal impact on fleet productivity. The basic problem resides in the fact that even the most advanced patterning exposure tools possess an intrinsic unique pattern placement error signature, both at the full wafer (sometimes called grid) level and at the individual field (sometimes call shot) level. This is due to residual imperfections in both the optical and mechanical systems of the patterning tool (also referred to herein as an exposure system) which differ from tool to tool, varying by tool identity, by tool model, by tool generation, by tool vendor, and even by tool component and illumination conditions. In order to meet ever shrinking alignment control requirements, the exposure tools require more and more sophisticated control methodologies. In an effort to meet these demands, exposure systems include an ever increasing array of adjustment features with more and more degrees of freedom, all directed toward error compensation.

In an ordinary process an exposure system is obtained by an end user and then calibrated such that it performs within its manufacturer specifications. Only then can such systems take their place in the manufacturing fleet. However, the inventors point out that even though such systems are calibrated to within manufacturer specifications, each tool demonstrates some degree of pattern distortion and misalignments making it imperfect. Ordinarily such imperfections are not particularly troublesome. However, with the pressure to obtain ever shrinking feature sizes and the associated need for greater precision, such systems are under pressure to demonstrate improved precision. Thus, increasingly even systems calibrated to manufacturer specifications are under increased pressure for greater fidelity. The presence of these residual errors can be compounded when combined with other tools which have their own intrinsic errors.

Accordingly, metrology tools are currently used in the art to measure and quantify errors, distortions, and misalignments in each exposure system. Commonly, the exposure systems will be calibrated using highly precise test wafers featuring many alignment targets and a peerless surface. The exposure systems are used to form lithographic patterns on the test wafers. The test wafers are then subject to metrology testing (overlay alignment metrology and the like) to determine the degree of fidelity possible with each exposure system. The degree of error present in each machine is determined.

It turns out that machines demonstrate a few general categories of error propagation. Accordingly, machines having similar error propagation properties are typically grouped together so that pattern alignment can be maintained to a reasonable degree. This principle is depicted in the extremely simplified illustration of FIG. 1. An intended pattern 101 is depicted here as a square pattern. A fleet of exposure systems (A, B, C, D, E, F) is also shown. Each exposure system includes its own distortion signature causing it to deviate from a perfect replication of the intended pattern 101. As mentioned above, the systems frequently demonstrate distortion signatures that are similar to each other. For example, exposure systems A, B, & C of Group 1 have somewhat similar distortions signatures. Also, exposure systems D, E, & F of Group 2 have somewhat similar distortions signatures. However, it is noted that the signatures of the Group 1 systems vary rather more substantially from the signatures of the Group 2 systems. As a result, the Group 1 systems generally are used together and the Group 2 systems are used together. For example, in fabricating lithography layers on a lot of wafers, layer one is formed using system A, layer two is then formed using system B, and layer three is then formed using system C. Thus, relatively good alignment can be maintained using the systems grouped this way. There are some drawbacks to such a system. For example, when a fourth layer is desired to be formed, the wafer is loaded again onto system A and a fourth layer is formed. However, if none of the Group 1 tools are available (i.e., they are currently in use) the process has a bottleneck. The Group 2 tools can not be used because of the variance in signature between the Group 1 and Group 2 systems. Thus, it is possible, for the process to come to a halt, and additionally, the Group 2 systems may lie unused for an extended period of time. Although, on its surface this may seem like a relatively minor problem, one must consider that in many cases, the exposure systems cost $40,000,000 or more each. The cost for idling such an expensive tool is astronomical. Currently, that is the current state of the art.

In some cases adjustments at the set-up stage can be used to harmonize the distortion caused by each machine as much as possible to attempt to overcome the intrinsic mismatches between different exposure tools in the fleet. In some existing methods one may perform so-called "mix & match" activity during the initial ramp up of an exposure fleet prior to, or in parallel, to bringing exposure systems on-line in a manufacturing environment. Since no "absolute" grid reference exists, back to which the relative displacements of the individual exposure tools can be compared, a "golden exposure tool"

and a "golden reticle" or both may be selected, and the golden tool and reticle are then used in various scenarios to generate a mix & match database of discrepancies for each exposure tool relative to the golden exposure tool. This technique generally require a lengthy sequence of exposures and subsequent processing of test wafers, followed by intensive high density overlay metrology using a tool such as the Archer AIM overlay metrology tool manufactured by KLA-Tencor on the test wafers. A description of such a procedure is given in the following reference: S. J. DeMoor, J. M. Brown, J. C. Robinson, S. Chang, and C. Tan, "Scanner overlay mix and match matrix generation: capturing all sources of variation" Proc. SPIE Int. Soc. Opt. Eng. 5375, 66 (2004), which document is incorporated herein by reference it its entirety for all purposes. This practice suffers from a number of deficiencies, including time consuming labor intensive non-automated analysis, risk of errors, and that over time, the database can become an inaccurate reflection of the current status of the tool set due to drifts or maintenance induced modifications.

Improved methods for optimizing alignment in a fleet of exposure systems is needed. Among other things, this disclosure seeks to provide solutions to this problem. Accordingly, the embodiments of invention present substantial advances over the existing methodologies and overcome many limitations of the existing pattern fabrication arts. These and other inventive aspects of the invention will be discussed herein below.

SUMMARY OF THE INVENTION

In accordance with the principles of the present invention, methods and systems for achieving optimized alignment performance in a fleet of lithographic exposure systems are disclosed.

Numerous aspects of the present invention are described in detail in the following description and drawings set forth hereinbelow.

In one embodiment, a method for optimizing alignment performance and productivity of a fleet of exposure systems is disclosed. The method involves characterizing each exposure system in a fleet of exposure systems to generate a set of distinctive distortion profiles associated with each exposure system. The set of distinctive distortion profiles are stored in a database. A wafer having reference pattern formed thereon is provided for further pattern fabrication and an exposure system is selected from the fleet to fabricate a next layer on the wafer. Linear and higher order parameters of the selected exposure system are adjusted to model the distortion of the reference pattern and/or the systems used to make the reference pattern. Once the exposure system is adjusted, it is used to form a lithographic pattern on the wafer.

Embodiments of the invention also enable updating the distortion profile information. For example, production metrology information concerning the lithographic patterns formed on wafers can be obtained by measuring production wafers metrology tools and using the metrology information to update the distortion profile information regarding the exposure systems.

Method embodiments of the invention include the acquisition and storing of context information. Such information can be obtained during pre-production characterization and is used to generate distinctive distortion profiles that include linear distortion effects and high order distortion effects attributable to at least one of: distortions attributable to different reticles, distortions attributable to different exposure systems, distortions attributable to different stages of an exposure system, distortions attributable to different scan directions used in fabricating layers with exposure systems, distortions attributable to different chuck systems employed with exposure systems, distortions attributable to different illumination conditions.

Another embodiment includes computer program products used to implement methodologies described herein.

Also, a computer controlled network of exposure systems and inspection tools arranged to enable real-time adjustments of higher order distortion parameters is disclosed. One architecture embodiment of this type includes a group of lithography exposure systems linked to an exposure system control server enabling control of the exposure systems and a group of metrology tools linked to a metrology system control server. Additionally, the architecture includes databases of accumulated distortion profiles characteristic of each of the exposure systems. The databases store exposure system distortion information characterizable by higher order distortion models or included in look-up tables stored in the databases. Such databases can be stored on one of said servers. The architecture is further configured to include a direct link between the exposure system control server and the metrology system control server that enables the transmission of exposure system distortion profile information between the exposure system control server and the metrology system control server. This direct link can enable real-time adjustment of high order parameters or look up table information for the exposure systems during production.

These and other aspects of the present invention are described in greater detail in the detailed description of the drawings set forth hereinbelow.

BRIEF DESCRIPTION OF THE DRAWINGS

The following detailed description will be more readily understood in conjunction with the accompanying drawings, in which.

It is to be understood that, in the drawings, like reference numerals designate like structural elements. Also, it is understood that the depictions in the Figures are not necessarily to scale.

DETAILED DESCRIPTION

Figure 1:
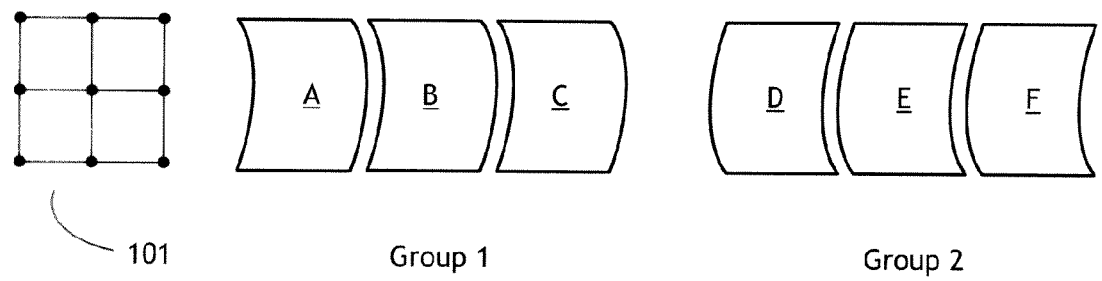
FIG. 1 is simplified figurative depiction of error matching in a lithography exposure system, such a stepper or scanner, used to pattern a substrate or wafer.

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

The following detailed description describes various embodiments of a method and approach for optimizing alignment among the exposure systems of a fleet of exposure systems. The methods disclosed herein the rapid selection and adjustment of exposure based on real-time considerations present in mass production manufacturing environment such as in a factory setting.

The disclosed invention enables the use of initial characterization information to make parameter adjustments to selected tools to enable selected systems in the fleet to be employed in fabrication processes on an as needed basis. The system and approach disclosed herein is flexible, fast, and enables optimized utility in a fleet of exposure systems. Many embodiments are disclosed herein however the invention is not intended to be limited to only the disclosed embodiments.

As hinted at above, one of the problems presently encountered by present fabrication technologies (particularly photolithography) is that they are approaching a level of fabrication accuracy that is challenging the accuracy of current fleet management approaches. The present inventions disclosed herein offer solutions to some of these problems and represent a significant improvement in the art.

It should be noted that distortions caused by fabrication systems are well studied in the art. In general such errors and distortions can be characterized as linear distortions and higher order distortions. Generally, when a wafer layer is fabricated it is subject to metrology (e.g., overlay metrology and so on) processes to determine the fidelity of the fabricated layer. Such metrology examines many features to make a determination of layer fabrication suitability. One feature is alignment accuracy. A series of measurements of the fabricated layer are made and compared with a series of alignment targets and other associated features to determine the accuracy of the layer fabrication process. The information received by these metrology measurements can be mapped and modeled to produce a model of exposure system performance. Such models can describe exposure system performance on both the field and wafer levels. The modeling can be used to describe the fabrication alignment distortion in linear terms and higher order terms. Alternately, the distortions may be described by a look up table approach, in which, for instance, the linear field distortion terms for each field are described independently for each field. Linear terms describe such things as simple pattern translation in an x or y direction, pattern rotation, scaling problems, and are generally of the same order of magnitude across the modeled surface (be it field or wafer, depending on the extent of the modeled surface).

Figure 2:
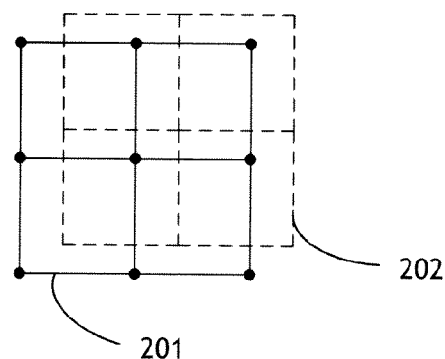
FIG. 2 is simplified schematic depiction of a linear distortion produced by a lithography exposure system.

FIG. 2 presents one simplified embodiment of a linear distortion or displacement error. The displaced pattern 202 (depicted with dashed lines) is shown superimposed over the intended position 201. The displaced is a translation in both the x and y directions and can typically be corrected using existing technologies.

However, lithography patterns are also fraught with numerous "higher order" distortions. Such "higher order" distortions are distortion patterns that demonstrate non-linear behavior. Typical "higher order" distortions include, but are not limited to, second order distortions (where the distortions vary with respect to the square of the distance), third order distortions (where the distortions vary with respect to the cube of the distance), trapezoidal distortion patterns, s- and c-shaped distortion patterns, bowed patterns, $4^{th}$, $5^{th}$ and $6^{th}$ order distortions, and many more essentially any non-linear distortion pattern. A non-exclusive list of such distortion patterns is provided as part of Appendix A.

An important point to be made here is that most modern exposure systems include adjustable parameters capable of being varied to account for these effects. In the prior art such adjustments are done once when the machines are received at the factory floor and adjusted to meet manufacturer specifications. What is not done in the previous art is a further optimization of the exposure tool parameters to enable the systems to adjust to optimize an entire fleet of systems for maximized performance. Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In one approach a methodology for optimizing exposure systems of the fleet is described. Reference is now made to the illustrative flow diagram of FIG. 3. Upon introduction of an exposure system to the fleet, the system is characterized (Step 301). Typically, this involves using the exposure system to fabricate a layer on a target wafer using a desired mask reticle. This target wafer is of course a specially prepared wafer having many metrology targets and other alignment sites to enable high quality metrology measurements to be obtained. The layer is then subjected to many metrology measurements to obtain highly detailed alignment information. For example, using an Archer AIM overlay metrology tool produced by KLA-Tencor of San Jose, Calif. One particularly useful implementation of the principles of this invention relates to applications of the instant principles to integrated metrology tools. Such integrated metrology tools can include metrology tools (e.g., overlay tools) that are integrated into fabrications tools (like, scanners and steppers and so on). As such, these integrated metrology tools are particularly well suited to maximize the principles of the present invention. Such integrated metrology tools are new and include such concepts as those embodied in tools like the iArcher overlay metrology tool conceived of by KLA-Tencor of San Jose, Calif. Additionally, the reticle itself can be analyzed to determine errors in the reticle (which can be used elsewhere in the process to correct for reticle induced pattern distortions). The metrology information is then used to model the distortion pattern on the surface. This model can be corrected for errors present in the reticle. Additionally, the metrology information can be used to model the distortion caused by the exposure system. Unlike methodologies known in the prior art. Many different aspects of the exposure system can be modeled and separately inventoried and stored. For example, layers can be formed using the same exposure system but the illumination conditions can be changed. For example, measurements can be made on layers formed using annular illumination, quadrapole illumination, and so on. Thus, each relevant illumination condition for the system can be modeled. A separate data file can be generated for each variable distortion causing parameter in an exposure system (Step 303). For example, a distortion profile can be generated and stored for each illumination condition of the exposure system. Specifically, the database can be made more granular. In multi-stage exposure systems, measurements can be made of layers formed with each stage of the exposure system. Also, layers and associated measurements can be made for each chuck used in an exposure system. Additionally, layers and associated measurements can be made for each scan direction used in an exposure system. In this way, the databases can be enhanced to include distortion profiles that capture the distortion effects caused by variation in scan direction in an exposure tool. Also, each of these layers and measurements can be repeated for each combination of variables listed above as well as any others deemed relevant. Also, the measurements can be modeled on a per field basis or on a per wafer basis. This information can be stored as a set of distinctive distortion profiles that characterize each exposure system. The distortion profiles can also include reticle information that includes the amount of distortion introduced be each specific reticle. The databases can also be stored as distortion profiles that are basically differences information ("delta's") that define the amount of change induced by the presence of one or more of the above referenced confounding factors. Additionally, the data can be enhanced by dynamic sampling which will be discussed in greater detail elsewhere in this patent. Thus, the initial calibration to manufacturer specification is also expanded to characterize the exposure system in a plurality of exposure profiles that is distinct to each system and its subsystems (illumination, stage motion properties, chuck effects, and so on).

Once the initial characterization is complete and a wafer is provided for further fabrication (Step 305). The stored distortion profiles for the exposure systems can be used to enhance the fabrication of wafer patterns. Once a wafer has a pattern formed thereon by a specified exposure tool (under known fabrication conditions which are tracked by the system), the distortion profiles can be used to determine the degree of distortion in the pattern formed by a specific exposure system (including reticle distortion effects, illumination distortion effects, stage effects and so on). Thus, much history is known about the distortion pattern of previous patterning steps.

Once a wafer is received and a reference pattern is identified (a reference pattern being a pattern to which other subsequently formed layers are aligned), the exposure system to be used for further fabrication is selected from the fleet of exposure systems (Step 307). This exposure system can be a system that has a distortion pattern that is generally similar to that of the reference pattern already formed on the wafer (such as indicated in e.g., FIG. 1)). Or it can be any of the exposure systems in the fleet. For example, it can be the first available system. The selection of the exposure system can be using a so-called "best-fit" system whereby the original calibration specification information is known and the tool that best matches the distortion properties of the reference layer is chosen. Using the finer granularity of adjustment possible with the present invention, such a best fit system can take into consideration many distortion factors including, but not limited to, illumination conditions, stage ID, chuck ID, stage scan motion direction, and even in some cases, the reticle used. Thus, a system that best models the desired distortion signature can be used. However, in many situations the chosen exposure system will merely be the first available tool.

In the prior art once an exposure tool was calibrated to within the manufacturer's specification that was the end of adjustment. Not so in the present invention. The inventors specifically contemplate further adjusting the adjustable parameters of the selected exposure system so that the selected exposure system distortion models the distortion present in the previously formed reference pattern (Step 309). Typically, this means that the pattern can be adjusted for first order distortions and errors such that the first order distortion of the selected exposure system is similar to the first order distortion present in the reference pattern. Still more significantly, the high order parameters are adjusted to so that the selected exposure system has high order distortion that models (or is otherwise similar to) the high order distortion pattern of the previously formed reference pattern. This can include the deliberate introduction of distortion into an exposure tool so that the distortion models that of the tool used form the reference pattern. This is new. Additionally, these changes to the high order parameters can be done in "real-time" just as needed upon the selection of the exposure tool to be used. Aspects of the system architecture facilitate such a real-time implementation and are discussed herein below with respect to FIG. 4.

Once the parameters are suitably adjusted, the selected exposure system forms a desired lithographic pattern on the wafer (Step 311). This process can be repeated as necessary to fabricate as many layers as needed.

Figure 4:
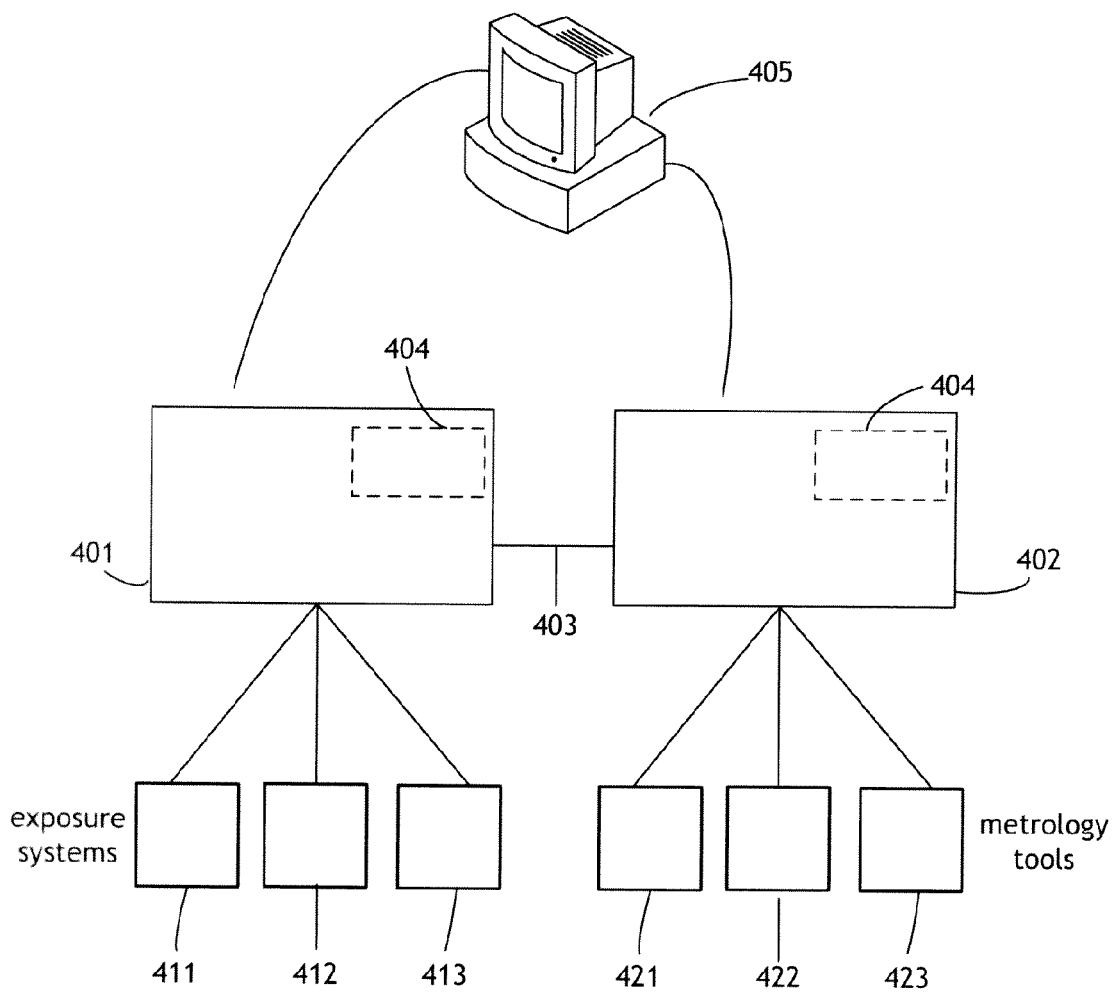
FIG. 4 depicts a simplified exemplar system architecture embodiment for implementing the principles of the invention.

FIG. 4 illustrates, in a simplified block diagram, a network architecture suitable for implementing embodiments of the invention. A fleet of exposure systems 411, 412, 413 (embodiments of the invention can implement a fleet having any number of systems) suitably equipped with reticles, stages, chucks, and all the other accouterments of lithographic patterning is in communication with an exposure system control server 401. Such communication can be established by any number or linking technologies (internet, intranet, WAN, LAN, wireless or wired connections and so on). Additionally, a group of metrology tools 421, 422, 423 (the embodiments of the invention contemplate any number of tools) in communication with a metrology system control server 402. Additionally, the databases 404 of accumulated distortion profile information (that characterizes each of the exposure systems) is stored on at least one of the servers 401, 402. The metrology system control server 402 is in direct communication 403 with the exposure system control server 401. This enables high speed communication between the two servers and also enables high speed communication between the databases and the exposure and metrology tools. Accordingly, such an architecture enables the real time transmission of information to the fleet of exposure tools enabling real-adjustment of high order distortion parameters. A user interface 405 enables control and input of data to the system if desired.

Figure 3:
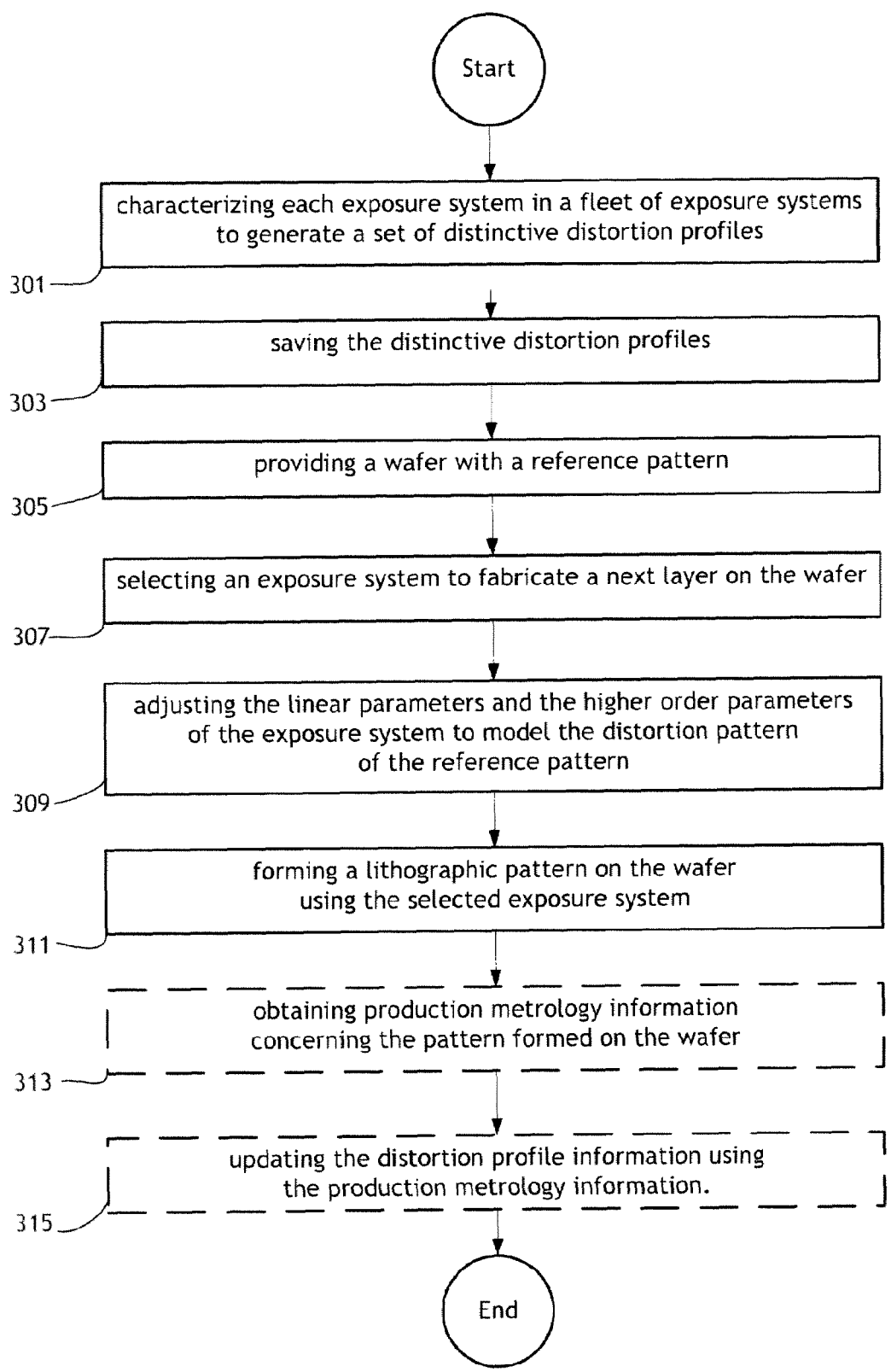
FIG. 3 is a simplified flow diagram illustrating a method embodiment that implements process operations in accordance with an embodiment of the invention.

Another aspect of the invention is further disclosed with respect to the optional steps (Steps 313, 315) disclosed in FIG. 3. The system is not forced to rely on characterization information provided using test wafers only. Because the system employs metrology devices to continuously test production wafers (Step 313), the system is awash in production data which can be used to influence parameter adjustments. This continuous stream of metrology measurements of production wafers can provide information that can be used to gauge the drift in measurements over time. Thus, exposure systems which begin to drift to far out of alignment can be recognized. Once recognized, these tools can be subjected to a re-characterization process wherein test wafers are run with a suspect exposure tool to determine if the initial distortion correction parameter settings are correct. Alternatively, such re-characterization can reveal that there is a need to adjust the system parameters to recalibrate the distortion profiles thereby enabling the exposure system to again provide satisfactory output (Step 315).

In one other implementation, the production metrology data can be used to update the profiles without the need for re-characterization using test wafers. The data obtain from production wafer metrology is typically corrected for reticle error, existing error in the reference pattern, and surface topology related errors caused by the presence of preexisting surface layers. Also, certain corrections must be made to deal with the lower signal-to-noise ratios experienced when using production wafer information.

The inventors point out that in one specific example of a proposed methodology, the mix & match database of distortion profiles can be dynamically updated over time, instead of remaining a static set of correctibles that is constant over time. In one implementation, this can be accomplished by using the overlay data that is collected on product wafers to refresh the database contents. In one scenario, a mix & match (M&M) database contains an array of up to $L^2 \times N^2$ correctible sets where N is the number of exposure tools and L the number of illumination conditions in the exposure tool fleet. Thus, one basic element of the database is a combination of exposure tool and illumination condition which indicates the sequence of subsequent layer exposures and not a specific exposure tool and illumination condition representing a specific exposure event. Although this substantially enlarges the size of the database, it significantly improves the functionality of the database and obviates the need to know which scanner in a sequence of two subsequent exposures is responsible for the drift or change. As indicated above, an added database refinement expands the database to store data from different reticle sets, i.e. different product separately. An alternative to this is described in the section below on reticle errors. A practical aspect to implement such a technique in a timely and efficient fashion comprises utilizing the direct data exchange link between the metrology server and the exposure tool fleet control server.

As pointed out briefly above, production data can be used to update the distortion profiles in the database. However, one issue with using such data is that errors and distortions in product reticles must be taken into account or compensated for. This is because these effects can vary from reticle to reticle and from wafer lot to wafer lot independently of the exposure tool sequence. Therefore, in one implementation, the distortions and errors in each reticle used are independently characterized by an alternative method. For example, direct reticle feature placement metrology can be performed on all of the reticles participating in the exposure sequence. Such can be conducted using, for example, a reticle metrology tool such as a Leica iPRO system available from Leica Microsystems, Inc. of Chantilly, Va. Once the reticles are characterized, the reticle error can be removed from information obtained during production metrology data prior to incorporation of the data in the data base. Additionally, instead of taking into consideration only the errors introduced by the presently patterning reticle, the production data can be made more accurate by taking into account the existence of feature placement errors in the product reticles used in the previous product exposures. Thus, compensation data can account for errors in the underlying reference pattern (e.g., reticle errors in the reticle used to form the reference pattern) as well as errors in the reticle being used to fabricate the current layer. Such reticle error data can be made available in a number of ways including through access to a reticle data base that includes all such data as part of the distortion profile data base, or direct file input of the reticle data, or by accessing a fabrication facility host computing system.

As an aside, the inventors point out that the nature of the linear errors discrepancies between different scanners can easily be corrected for. It is common practice today to routinely correct for the linear overlay errors between subsequent exposure steps leaving the higher order terms to be managed by different strategies. By linear error, we mean (as indicated above) that overlay errors between two subsequent patterning steps that can be modeled as a linear function of the spatial location across a field or across a wafer. These are supplemented by the high order distortion information that remains after linear corrections are implemented.

With further reference to FIG. 3, the operations identified by Steps 313 and 315 enable an evolving data base of distortion profiles to be generated. For example, an initial set of set of distortion profiles is obtained from the pre-production characterization using target wafers. This data could then used to generate an initial differential mix and match database by subtracting results from all combinations if desired. Many other ways of employing such data will be apparent to those of ordinary skill. In one embodiment, this initial database can then used as the basis from which an evolving database is generated as new production data becomes available. The updated database can make available a steadily improving set improved set of correction parameters applicable to subsequent production. The inventors point out that, since the production wafer overlay is also impacted by previous and current layer reticle errors, they must be accounted for. In one implementation, these errors are superimposed on the improved set of correction parameters from the database before application to an exposure system. After exposure, further overlay metrology is performed and the data is used to update the database. However, this data is typically imperfect and can be "contaminated" by reticle previous and present reticle distortions. The data can be "corrected" to account for these reticle induced distortions prior to entry into the database. Additionally, if desired, two separate databases can be used, one the mix & match database where each element in the database is a particular exposure tool/illumination combination generated by on wafer overlay metrology and the other a reticle error database generated by direct feature placement metrology on the reticle. Since the production data is of finite accuracy and precision, it may also be desirable to keep production "correctibles" (or correction data) generated by metrology tools in the database, but to generate modified correctibles by using noise reduction techniques (one example being to use a "moving average" of the production data).

Additionally, the inventors contemplate the employment of sampling methodologies to enhance the accuracy of the distortion profile database and otherwise enhance the data. Such sampling can be employed at the front end when the exposure systems are characterized and also to the metrology data obtained during the production stage. In order to enable high order parameter correction data to be extracted from production data, enhanced sampling is implemented beyond that currently used in standard production metrology. Standard overlay metrology sample plans are designed to enable linear models and hence typically use only 4 to 5 alignment sites (e.g., overlay targets) per field and perhaps up to 9 fields per wafer. As explained herein, the methodologies disclosed herein correct for high order distortion. In order for production data to be useful in modeling such high order distortion, more overlay metrology (e.g., misregistration monitoring) sites are generally required. For example, if up to $3^{rd}$ order polynomial spatial behavior is to be modeled then a minimum of 10 sites per field are typically used to enable twenty or so free parameters that are used in the model of high order distortion behavior. In practice, much higher density sampling would be used in order to achieve reasonable levels of statistical uncertainty in the high order model. A similar situation exists for the wafer level high order sampling. It should be noted however, that if certain specific information is available about the sources of variation in the overlay data in advance, then this can be used to generate an optimized sample plan to best characterize these sources of variation. By way of example, if it is known that the high order field dependence of the overlay is different for different scan directions in the case of a scanner, then the sample plan should ensure coverage of fields printed with all combinations of scan directions of the two subsequent exposure steps. Again, the information regarding the direction of scan as well as other lithographic data of significance in determining the sample plan can be made available by a direct link between the database device and the exposure tool fleet management system.

In one embodiment, the sampling can be used to obtain only data from a select group of wafers. For example, when used in initial characterization, a group of test wafers is provided and patterns are formed thereon using exposure tools. The wafers are then subject to metrology to determine the degree of distortion in the exposure systems (reticles, stages, chucks, illumination conditions and so on). However, rather than just randomly select the wafers to use in obtaining the characterization data, only selected wafers will be used in such analysis. For example, the degree of alignment with overlay targets can be determined. In one example, a set of wafers demonstrates a varying degree of alignment with the targets. A first wafer is aligned with respect to 99% of the targets, a second wafer to 99% of the targets and so on until all of the wafers in a lot are characterized. In the following examples, the alignment of a group of wafers includes alignment percentages as follows: 99, 98, 99, 81, 65, 99. A threshold can be chosen by the process engineer. For example, the threshold can be set to accept only wafers having an alignment with 99% of the targets or better. Alternatively, different alignment criteria could be used (e.g., only wafers having alignment of 85% or less, if a worse case scenario is desired). Thus, a first group of wafers is selected to meet the threshold criteria. Only the wafers meeting the threshold criteria are then evaluated. Thus, in the above case, the highly aligned wafers can be used to provide a highly accurate data concerning exposure system distortion. Under such circumstances the 99% group provides a group of wafers having satisfactory alignment. Additionally, where production data is used (instead of target wafers) a similar threshold concept can be used to select the production wafers that will be used. This is where it becomes advantageous to have production wafers having a large number of alignment targets as, for example, indicated above. Thus, the best wafers are used to obtain the most representative distortion information. Also, poorly aligned production wafers can be used to give indications of the worst-case distortion scenarios.

By monitoring the evolution of the scanner matching database over time, it is possible to monitor the stability of the exposure tools and to use this data to generate preventive maintenance when certain parameters go beyond control boundaries. Although production data always contains overlay signatures resultant from two subsequent exposures, by summing (or any other reasonable algebraic operator) over all data from a single exposure tool, it is generally possible to differentiate effects from different tools and to identify problematic exposure systems. In one approach, the distortion profile information can be updated in accordance with a predetermined schedule. Perhaps every three months a re-characterization of the exposure system is conducted using an analysis of a new batch of test wafers. Additionally, the post-production metrology analysis of wafer pattern alignment can be used to identify a time-based drift in a fabricated wafer pattern. Once the drift extends beyond a specified threshold re-characterization can be done. Additionally, under such circumstances the inventors contemplate that the distortion profile information can be updated using production metrology information.

One concern in the use of metrology data from production wafers is that the quality of the metrology data may be influenced by the significant additional processing applied to these wafers compared with test wafers. In order to mitigate this risk, one option is to apply a weighting function or even reject production data based on metrology diagnostic data. One example of such a process is disclosed in U.S. Pat. No. 6,928,628 issued 9 Aug. 2005 by Seligson et al., which is directed to target diagnostics. The aforementioned patent is incorporated herein by reference in its entirety for all purposes.

The invention employs a combination of hardware and software components. The software can be embodied as computer readable code (or computer program code) on a computer readable medium. The computer readable medium is any data storage device that can store data which can thereafter be read by a computer system. Examples of the computer readable medium include read-only memory, random-access memory, CD-ROMs, magnetic tape, and optical data storage devices. The computer readable medium can also be distributed over a network coupled computer systems so that the computer readable code is stored and executed in a distributed fashion. In one implementation the computer readable medium comprises memory of the server systems 401, 402 of FIG. 4.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method for optimizing alignment performance and productivity of a fleet of exposure tools, the method comprising:
   a) characterizing each exposure system in a fleet of exposure systems to generate a set of distinctive distortion profiles associated with each exposure system;
   b) saving each of the distinctive distortion profiles in a data base;
   c) providing a wafer with a lithographically formed pattern fabricated thereon, the lithographically formed pattern including a reference pattern having a distortion pattern;
   d) determining a selected exposure system from among the fleet of exposure systems to fabricate a next layer on the wafer;
   e) adjusting the linear parameters and the higher order parameters of the selected exposure system to model the distortion pattern of the reference pattern; and
   f) forming a lithographic pattern on the wafer using the selected exposure system.

2. The method of claim 1 wherein:
   said characterizing a) includes classifying the exposure systems into exposure system groups, with a first group comprising a first set of exposure systems demonstrating a first pattern of high order distortion characteristics and a second group comprising a second set of exposure systems demonstrating a second pattern of high order distortion characteristics, wherein the first and second patterns of distortion characteristics are not the same;
   said providing the wafer c) comprises providing a wafer with the reference pattern formed by an exposure system of the first group and therefore exhibiting a first pattern of high order distortion characteristics;
   said determining a selected exposure system d) includes selecting an exposure system from the second set of exposure tools having distortion associated with the second pattern of high order distortion characteristics; and said adjusting e) includes adjusting the selected exposure system from the second set of exposure tools so that a distortion is deliberately introduced into the selected exposure system such that the distortion models the first pattern of high order distortion characteristics.

3. The method of claim 1 further including:

g) obtaining production metrology information concerning the lithographic pattern formed on the wafer, said metrology information obtained by measuring production wafers with at least one of the metrology tools; and h) updating the distortion profile information regarding the exposure systems based on the obtained production metrology information.

4. The method of claim 3 wherein updating the distortion profile information includes updating distortion profiles using the production metrology information obtained in g) and adjusted the metrology information to compensate for errors in a reticle used to form the reference pattern.

5. The method of claim 3 wherein updating the distortion profile information includes updating distortion profiles using the production metrology information obtained in g) and adjusted the metrology information to compensate for errors in the reticle used to f) form the lithographic pattern on the wafer.

6. The method of claim 3 wherein updating the distortion profile information includes updating distortion profiles using the production metrology information obtained in g) and adjusted the metrology information to compensate for errors in an exposure machine used to 0 form the lithographic pattern on the wafer.

7. The method of claim 3 wherein updating the distortion profile information includes updating distortion profiles using the production metrology information obtained in g) and adjusted the metrology information to compensate for the presence of previously formed layers on the wafer surface.

8. The method of claim 3 wherein g) obtaining production metrology information concerning the lithographic pattern formed on the wafer is achieved using an integrated metrology tool.

9. The method of claim 3 further including, i) communicating the updated the distortion profile information to the exposure systems via a direct link between an exposure system server and a metrology server.

10. The method of claim 3 wherein g) obtaining production metrology information includes providing a pattern alignment drift threshold and obtaining metrology information indicative of a changing degree of pattern alignment in an exposure system over time; and wherein h) updating the distortion profile information includes updating the distortion profile information for the affected exposure systems when the degree of change in the pattern alignment exceed the drift threshold.

11. The method of claim 10 wherein h) updating the distortion profile information includes obtaining new distortion profiles for the affected exposure systems by using test wafers.

12. The method of claim 3 wherein h) updating the distortion profile information includes updating the distortion profiles for the affected exposure systems using metrology information obtained from production wafers that have been subjected to metrology.

13. The method of claim 3 wherein g) obtaining production metrology information includes:

providing a production wafer tot comprising a plurality wafers and patterning the wafers with the exposure systems of the fleet of exposure tools;

determining the degree of alignment in an associated exposure system for each measured production wafer;

selecting production wafers based on an alignment threshold;

measuring distortion profile information for the exposure tools using only data obtained from the selected production wafers; and wherein h) updating the distortion profile information is done using production metrology information obtained from said selected production wafers.

14. The method of claim 1 wherein a) characterizing each exposure system in a fleet of exposure systems includes calibrating each exposure system to predetermined specification and generating the distinctive distortion profile associated with each calibrated exposure system.

15. The method of claim 14 wherein generating the distinctive distortion profile associated with each exposure system includes:

accounting for distortion induced by each specific reticle used to form patterns with each exposure system.

16. The method of claim 15 wherein e) adjusting the parameters includes using the distortion profiles to account for distortions in the reference pattern induced by distortions in a prior reticle used by a prior exposure machine to form the reference pattern and using the distortion profiles to account for distortions in the reticle to be used to print the present lithographic pattern on the wafer.

17. The method of claim 14 wherein generating the distinctive distortion profile associated with each exposure system includes:

accounting for distortion induced by the operation of each specific stage element employed by each exposure system.

18. The method of claim 14 wherein generating the distinctive distortion profile associated with each exposure system includes:

accounting for distortion induced by each specific illumination condition used by the exposure system.

19. The method of claim 14 wherein generating the distinctive distortion profile associated with each exposure system includes:

selectively sampling test wafers used to generate the distinctive distortion profile for each exposure system.

20. The method of claim 19 wherein selectively sampling the test wafers used to generate the distinctive distortion profile for each exposure system includes sampling such that result from best fit wafers are used to generate the distinctive distortion profile.

21. The method of claim 19 wherein selectively sampling the test wafers used to generate the distinctive distortion profile for each exposure system includes sampling such that result takes into account the direction of motion of stage elements used to generate the distinctive distortion profile.

22. The method of claim 19 wherein selectively sampling the test wafers used to generate the distinctive distortion profile for each exposure system includes averaging results from a selected set of test wafers to generate the distinctive distortion profile.

23. The method of claim 14 wherein generating the distinctive distortion profile associated with each exposure system includes:

accounting for distortion induced by each specific reticle used to form patterns with the associated exposure system.

24. The method of claim 1 wherein b) saving each of the distinctive distortion profiles comprises saving the profiles in a data base, wherein the saved profiles include linear distortion effects and high order distortion effects attributable to at least one of: distortions attributable to different reticles, distortions attributable to different exposure systems, distortions attributable to different stages of an exposure system, distortions attributable to different scan directions, distortions attributable to different chuck systems, distortions attributable to different illumination conditions.

25. The method of claim 24 wherein c) providing the wafer with the lithographically formed pattern that includes the reference pattern with a distortion pattern includes determining the distortion pattern in the reference pattern by referencing pattern distortion information stored in the data base.

26. The method of claim 1 further including periodically updating the distortion profile information based subsequent re-characterization of exposure systems in the fleet of exposure systems to generate an adjusted distortion profile associated with each updated exposure system.

27. The method of claim 26 wherein periodically updating the distortion profile information is conducted in accordance with a predetermined schedule.

28. The method of claim 26 wherein periodically updating the distortion profile information is conducted when a post production metrology analysis of wafer pattern alignment indicates a drift in a fabricated wafer pattern beyond a specified threshold.

29. The method of claim 1 wherein d) determining a selected exposure system from among the fleet of exposure systems to fabricate a next layer on the wafer comprises selecting a best available match from among the fleet of exposure systems wherein the best match comprises selecting an exposure system having a distortion profile that most closely matches the distortion pattern of the reference pattern on the wafer.

30. The method of claim 1 wherein d) determining a selected exposure system from among the fleet of exposure systems to fabricate a next layer on the wafer comprises:
   selecting an exposure system from among the fleet of exposure systems; and
   adjusting the high order distortion parameters of the selected exposure system so that they induce a degree of distortion in a fabricated pattern that models the distortion pattern of the reference pattern on the wafer.

31. The method of claim 1 wherein said characterizing a) includes: providing a wafer lot comprising a multiplicity of test wafers and patterning the wafers with the exposure systems of the fleet of exposure tools;
   determining the degree of alignment of each test wafer with the associated exposure system;
   rating the alignment using a threshold alignment value, above which, the alignment falls into a first group, and below which the alignment falls into a second group;
   characterizing the exposure tools using only data obtained from one group of the first and second groups.

32. The method of claim 31 wherein:
   the alignment of the first group comprises satisfactorily aligned wafers and the alignments of the second group comprises excursion wafers having unsatisfactory alignment; and
   characterizing the exposure tools is conducted using only data obtained from the satisfactorily aligned test wafers.

33. A computer program product embodied on a computer readable media including computer program code in a pattern fabrication control system wherein the pattern fabrication control system includes a group of exposure systems linked to an exposure system control server, a group of metrology tools linked to a metrology system control server, a database for storing distortion profile information concerning the exposure systems, the database stored on at least one of the servers, and a direct link between the exposure system control server and the metrology system control server, the computer program product including:
   computer program code instructions for characterizing each exposure system in a fleet of exposure systems to generate a set of distinctive distortion profiles associated with each exposure system;
   computer program code instructions for saving each of the distinctive distortion profiles in the data base;
   computer program code instructions for determining a selected exposure system from among the fleet of exposure systems, the selected exposure system being selected to fabricate a next layer on a wafer that has a reference pattern formed thereon;
   computer program code instructions for adjusting higher order parameters of the selected exposure system in real-time to enable the selected exposure system to model high order distortion patterns; and
   computer program code instructions for enabling the selected exposure system to form a lithographic pattern on the wafer using the selected exposure system.

34. The computer program embodied on a computer readable media of claim 33 further including:
   computer program code instructions for obtaining production metrology information concerning the lithographic pattern formed on the wafer, said metrology information obtained with at least one of the metrology tools; and
   computer program code instructions for updating the distortion profile information regarding the exposure systems based on the obtained production metrology information.

35. The computer program embodied on a computer readable media of claim 34 further including computer program code instructions for communicating the updated the distortion profile information from the metrology tools to the exposure systems via the direct link between the exposure system control server and the metrology system control server.

\* \* \* \* \*